(12) United States Patent
Park et al.

(10) Patent No.: US 9,698,317 B2
(45) Date of Patent: Jul. 4, 2017

(54) LIGHT EMITTING DEVICE HAVING UV LIGHT EMITTING DIODE FOR GENERATING HUMAN-FRIENDLY LIGHT AND LIGHTING APPARATUS INCLUDING THE SAME

(71) Applicant: Seoul Semiconductor Co., Ltd., Ansan-si (KR)

(72) Inventors: Sang Shin Park, Ansan-si (KR); Kwang Yong Oh, Ansan-si (KR); Myung Jin Kim, Ansan-si (KR); Ki Bum Nam, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 14/664,650

(22) Filed: Mar. 20, 2015

(65) Prior Publication Data
US 2015/0270449 A1  Sep. 24, 2015

(30) Foreign Application Priority Data
Mar. 21, 2014  (KR) ........................ 10-2014-0033340

(51) Int. Cl.
  *H01L 33/00*  (2010.01)
  *H01L 33/50*  (2010.01)
  *H01L 33/44*  (2010.01)

(52) U.S. Cl.
  CPC ............ *H01L 33/504* (2013.01); *H01L 33/44* (2013.01)

(58) Field of Classification Search
  CPC ......... H01L 33/60; H01L 33/20; H01L 33/62; H01L 33/54; H01L 33/44; H01L 33/504; H01L 33/10; H01L 33/405; H01L 33/42
  See application file for complete search history.

(56) References Cited

U.S. PATENT DOCUMENTS

| 6,914,250 | B2* | 7/2005 | Seville | G01N 21/6447 250/458.1 |
| 7,923,928 | B2* | 4/2011 | Kasakura | C09K 11/0883 313/498 |
| 2004/0119083 | A1* | 6/2004 | Su | H01L 33/60 257/98 |
| 2008/0211386 | A1* | 9/2008 | Choi | H01L 33/504 313/503 |

* cited by examiner

Primary Examiner — Benjamin Sandvik
Assistant Examiner — Damon Hillman
(74) Attorney, Agent, or Firm — Perkins Coie LLP

(57) ABSTRACT

The light emitting device includes: an ultraviolet light emitting diode emitting light in an ultraviolet wavelength region; and blue phosphors, green phosphors, and red phosphors excited by the ultraviolet light emitting diode, wherein white light is formed by synthesis of the light emitted from the ultraviolet light emitting diode, light emitted from the blue phosphors, light emitted from the green phosphors, and light emitted from the red phosphors, the white light includes ultraviolet light, green light, blue light, and red light, an intensity of a peak wavelength of the green light is in a range of 1.8 to 2.1 times the intensity of a peak wavelength of the blue light, and an intensity of a peak wavelength of the red light is in a range of 2.8 to 3.1 times the intensity of the peak wavelength of the blue light.

13 Claims, 3 Drawing Sheets

LIGHT EMITTING DEVICE HAVING UV LIGHT EMITTING DIODE FOR GENERATING HUMAN-FRIENDLY LIGHT AND LIGHTING APPARATUS INCLUDING THE SAME

CROSS-REFERENCE TO RELATED APPLICATIONS

This patent document claims priority from and the benefits of Korean Patent Application No. 10-2014-0033340, filed on Mar. 21, 2014, which is hereby incorporated by reference.

TECHNICAL FIELD

This patent document relates to a light emitting device and a lighting apparatus including the same. Some implementations of the disclosed technology relate to a light emitting device having an ultraviolet (UV) light emitting diode, and a lighting apparatus including the same.

BACKGROUND

A light emitting diode (LED), which includes a compound semiconductor having a p-n junction structure, emit predetermined light by recombining minority carriers (holes or electrons). The light emitting diode consumes low power, has a long lifespan, and may be installed in a narrow space. In addition, since the light emitting diode is robust to vibrations, the light emitting diode has been widely used in various lighting devices as well as various information processing and communication apparatuses.

SUMMARY

The examples of the disclosed technology provide a light emitting diode capable of emitting human-friendly light, and a lighting apparatus including the same.

The examples of the disclosed technology provide a light emitting diode capable of emitting light that does not hinder generation of Melatonin of a human body, and a lighting apparatus including the same.

The examples of the disclosed technology provide a light emitting diode capable of emitting white light including blue light having a low intensity, and a lighting apparatus including the same.

The examples of the disclosed technology provide a light emitting diode capable of emitting white light having an improved color rendering index, and a lighting apparatus including the same.

Examples of implementations of the disclosed technology include a light emitting device including: an ultraviolet light emitting diode emitting light in an ultraviolet wavelength region; and blue phosphors, green phosphors, and red phosphors excited by the ultraviolet light emitting diode, wherein white light is formed by synthesis of the light emitted from the ultraviolet light emitting diode, light emitted from the blue phosphors, light emitted from the green phosphors, and light emitted from the red phosphors, the white light includes ultraviolet light, green light, blue light, and red light, an intensity of a peak wavelength of the green light is in a range of 1.8 to 2.1 times the intensity of a peak wavelength of the blue light, and an intensity of a peak wavelength of the red light is in a range of 2.8 to 3.1 times the intensity of the peak wavelength of the blue light.

Therefore, a light emitting diode emitting white light including blue light having a low intensity may be provided.

An intensity of a peak wavelength of the ultraviolet light may be in a range of 3.8 to 4.1 times the intensity of the peak wavelength of the blue light.

The white light may have a color rendering index (CRI) of 95 or more.

The white light may have a special color rendering index (R9) of 90 or more.

A peak wavelength of the blue phosphor may be positioned in a range of 460 to 482 nm, a peak wavelength of the green phosphor may be positioned in a range of 520 to 545 nm, and a peak wavelength of the red phosphor may be positioned in a range of 610 to 650 nm.

A peak wavelength of the ultraviolet light emitting diode may be positioned in a range of 380 to 420 nm.

A half-width of a peak wavelength of the blue phosphor may be positioned in a range of 80 to 85 nm, a half-width of a peak wavelength of the green phosphor may be positioned in a range of 49 to 82 nm, and a half-width of a peak wavelength of the red phosphor may be positioned in a range of 66 to 93 nm.

The light emitting device may further include: a housing; and a molding part, wherein the ultraviolet light emitting diode is disposed in the housing, and the molding part covers the ultraviolet light emitting diode.

The blue phosphors, the green phosphors, and the red phosphors may be distributed in the molding part.

The housing may include a reflector reflecting the light emitted from the ultraviolet light emitting diode.

The housing may further include a barrier reflector covering the reflector.

The light emitting device may further include a buffer part disposed between the molding part and the ultraviolet light emitting diode, wherein the buffer part has a hardness lower than that of the molding part.

The molding part may include: a first molding part covering the ultraviolet light emitting diode; a second molding part covering the first molding part; and a third molding part covering the second molding part, the first molding part containing the red phosphors, the second molding part containing the green phosphors, and the third molding part containing the blue phosphors.

The light emitting device may further include: a housing; and a phosphor plate including the blue phosphors, the green phosphors, and the red phosphors, wherein the ultraviolet light emitting diode is disposed in the housing, and the phosphor plate is positioned above the ultraviolet light emitting diode so as to be spaced apart from the ultraviolet light emitting diode.

According to another exemplary embodiment of the present invention, there is provided a lighting apparatus including: a light emitting device, wherein the light emitting device includes: an ultraviolet light emitting diode emitting light in an ultraviolet wavelength region; and blue phosphors, green phosphors, and red phosphors excited by the ultraviolet light emitting diode, white light being formed by synthesis of the light emitted from the ultraviolet light emitting diode, light emitted from the blue phosphors, light emitted from the green phosphors, and light emitted from the red phosphors, a spectrum of the white light including ultraviolet light, green light, blue light, and red light, an intensity of a peak wavelength of the green light being in a range of 1.8 to 2.1 times the intensity of a peak wavelength of the blue light, and an intensity of a peak wavelength of the red light being in a range of 2.8 to 3.1 times the intensity of the peak wavelength of the blue light. Therefore, a lighting apparatus including a light emitting diode emitting white light including blue light having a low intensity may be provided.

An intensity of a peak wavelength of the ultraviolet light may be in a range of 3.8 to 4.1 times the intensity of the peak wavelength of the blue light.

A relative ratio of the intensity of the peak wavelength of the ultraviolet light, the intensity of the peak wavelength of the blue light, the intensity of the peak wavelength of the green light, and the intensity of the peak wavelength of the red light may be 4:1:2:3.

The white light may have a color rendering index (CRI) of 95 or more.

The white light may have a special color rendering index (R9) of 90 or more.

A peak wavelength of the blue phosphor may be positioned in a range of 460 to 480 nm, a peak wavelength of the green phosphor may be positioned in a range of 520 to 545 nm, and a peak wavelength of the red phosphor may be positioned in a range of 610 to 650 nm.

A peak wavelength of the ultraviolet light emitting diode may be positioned in a range of 380 to 420 nm.

DETAILED DESCRIPTION

Figure 1:
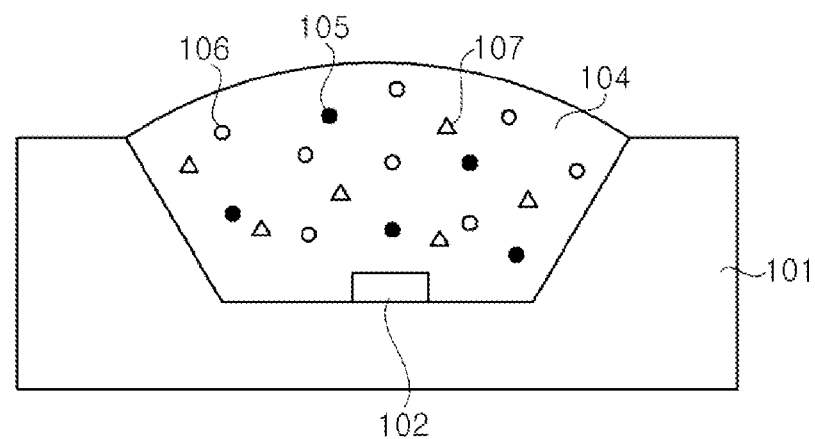
FIG. 1 is a cross-sectional view illustrating a light emitting device according to an exemplary embodiment of the disclosed technology.

Various types of light emitting diodes have been provided for various applications. For example, the light emitting diodes have been available, which emit light having a single wavelength such as blue, green, or red, or the like. Further, the white light emitting devices have been recently available. As the white light emitting devices are used in automobile products and general lighting products, a demand for the white light emitting devices is expected to increase.

There are various techniques for implementing the white light emitting device. For example, white light can be obtained using a blue light emitting diode chip, a green light emitting diode chip, and a red light emitting diode chip. In another example, white light can be obtained by a mixture of blue light emitted from a blue light emitting diode and yellow light emitted from phosphors excited by a portion of the blue light. The latter example has a simple configuration and provides advantages such as mass production characteristics and economic efficiency. However, the latter example has a disadvantage such as a low color rendering index.

Korean Patent Laid-Open Publication No. 10-2004-0032456 provides an example of the white light emitting device. In the disclosed light emitting diode, a blue light emitting diode chip is provided and a phosphor emitting yellowish green or yellow light is attached on the blue light emitting diode chip. The phosphor is configured to emit yellowish green or yellow light by using a blue light emission from the blue light emitting diode chip as an excitation source. Accordingly, the disclosed light emitting diode emits white light by a blue emission from the blue light emitting diode chip and an yellowish green or yellow light emission from phosphors.

In the case of implementing white light using a blue light emitting diode chip, blue light included in white light has a strong intensity. That is, although the white light including the blue light is viewed as white light, the blue light having a wavelength in a range of 440 to 460 nm serves as main light.

Blue light included in artificial lighting has a negative influence on Melatonin secretion of a human body. A decrease in the Melatonin secretion disturbs lifespan cycles of people and increases the incidence of breast cancer. Therefore, light having a wavelength in a range of 460 to 500 nm among optical spectra emitted by a lighting apparatus is classified as bad light.

Meanwhile, in addition to the above-mentioned techniques of implementing the white light, there is a scheme of implementing the white light using an ultraviolet light emitting diode and phosphors. However, since an intensity of blue light included in the white light implemented in this scheme is changed depending on a type and a mixing condition of phosphors, it is difficult to implement optimal white light that does not hinder a generation of Melatonin.

Hereinafter, exemplary embodiments of the disclosed technology will be described in detail with reference to the accompanying drawings. First, it is to be noted that in giving reference numerals to components of each of the accompanying drawings, the same components will be denoted by the same reference numerals even though they are illustrated in different drawings. Further, in describing exemplary embodiments of the disclosed technology, well-known functions or constructions will not be described in detail since they may unnecessarily obscure the understanding of the present invention. In addition, although exemplary embodiments of the disclosed technology will be described below, the scope of the disclosed technology is not limited thereto, but may be variously modified by those skilled in the art.

FIG. 1 is a cross-sectional view illustrating a light emitting device according to an exemplary embodiment of the disclosed technology. Referring to FIG. 1, the light emitting device is configured to include a housing 101, an ultraviolet light emitting diode 102, a molding part 104, green phosphors 105, red phosphors 106, and blue phosphors 107.

The ultraviolet light emitting diode 102, the molding part 104, the green phosphors 105, the red phosphors 106, and the blue phosphors 107 are disposed over the housing 101. The ultraviolet light emitting diode 102 is disposed over a bottom surface of the housing 101. The housing 101 may have lead terminals (not illustrated) installed thereon in order to input power to the ultraviolet light emitting diode 102. The molding part 104 includes the phosphors 105, 106, and 107 and covers the ultraviolet light emitting diode 102.

The housing 101 may be made of or include general plastic (polymer), metal, or ceramic. In the case in which the housing 101 includes a ceramic substrate, there is no risk that a color or quality of the housing 101 including the ceramic substrate will be changed by ultraviolet light emitted from the ultraviolet light emitting diode 102. Thus, reliability of the light emitting device may be maintained. The housing 101 may include an inclined inner wall in order to reflect the light emitted from the ultraviolet light emitting diode 102. As one example, in the present exemplary embodiment, since a light emitting diode is or includes the ultraviolet light emitting diode 102, the housing 101 may include the ceramic substrate.

The molding part 104 may be formed through an injection-molding process using a mixture of a predetermined epoxy or silicon resin and the phosphors 105, 106, and 107. The molding part 104 may be formed by injecting the mixture into a separate mold and compressing and heat-treating the mixture. The molding part 102 may be formed in various shapes such as a convex lens shape, a flat panel shape (not illustrated), a shape in which it has predetermined roughness or irregularities formed on a surface thereof, or the like. Although the molding part 104 has been described to have the convex lens shape in the present example of the light emitting device, other implementations are also possible regarding the shape of the molding part 104.

The ultraviolet light emitting diode 102 may emit light in an ultraviolet wavelength region. A peak wavelength of the light emitted by the ultraviolet light emitting diode 102 may be positioned in a range of 380 to 420 nm. Various types and material can be used for the ultraviolet light emitting diode 102 as long as the ultraviolet light emitting diode 102 may emit light in the corresponding wavelength region.

The red phosphors 106 may be excited by the ultraviolet light emitting diode 102 to emit red light. A peak wavelength of the red light emitted by the red phosphors 106 may be positioned in a range of 610 to 650 nm. The red phosphors 106 may emit red light having a half-width of 66 to 93 nm.

The green phosphors 105 may be excited by the ultraviolet light emitting diode 102 to emit green light. A peak wavelength of the green light emitted by the green phosphors 105 may be positioned in a range of 520 to 545 nm. The green phosphors 105 may emit green light having a half-width of 49 to 82 nm.

The blue phosphors 107 may be excited by the ultraviolet light emitting diode 102 to emit blue light. A peak wavelength of the blue light emitted by the blue phosphors 107 may be positioned in a range of 460 to 482 nm. The blue phosphors 107 may emit blue light having a half-width of 80 to 85 nm.

At least one of the red phosphor 106, the green phosphor 105, or the blue phosphor 107 may include at least one of a silicate phosphor, a YAG based phosphor, a nitride-based phosphor, a TAG-based phosphor, a sulfide-based phosphor, a BAM-based phosphor, a halogen-based phosphor, or a fluoride-based phosphors. Although red, green and blue phosphors 105, 106, and 107 have been described above, other implementations are also possible regarding the types of phosphors 105, 106, and 107. For example, any phosphors can be used for the light emitting device, which satisfy the above-mentioned peak wavelength and half-width.

White light may be emitted by synthesizing the light emitted from the ultraviolet light emitting diode 102, light emitted from the red phosphors 106, light emitted from the green phosphors 105, and light emitted from the blue phosphors 107. A color rendering index (CRI) of the emitted white light may be 95 or more. In addition, R9, which indicates a special color rendering index of the emitted white light, may be 90 or more.

The light emitting device and the lighting apparatus according to some implementations of the disclosed technology may emit white light close to natural light. In addition, the light emitting device and the lighting apparatus according to some implementations of the disclosed technology emit white light having a high color rendering index and including red light.

The white light emitted by the light emitting device according to the exemplary embodiment of the disclosed technology may include ultraviolet light, green light, blue light, and red light. An intensity of a peak wavelength of the green light may be in a range of 1.8 to 2.1 times the intensity of a peak wavelength of the blue light. An intensity of a peak wavelength of the red light may be in a range of 2.8 to 3.1 times the intensity of the peak wavelength of the blue light. An intensity of a peak wavelength of the ultraviolet light may be in a range of 3.8 to 4.1 times the intensity of the peak wavelength of the blue light. In some implementations, a relative ratio of the intensity of the peak wavelength of the ultraviolet light, the intensity of the peak wavelength of the blue light, the intensity of the peak wavelength of the green light, and the intensity of the peak wavelength of the red light may be 4:1:2:3. If the intensities of the ultraviolet light, the green light, the blue light, and the red light are in the ranges described above, the white light emitted by the light emitting device may have a high color rendering index and blue light having a low intensity.

Figure 2:
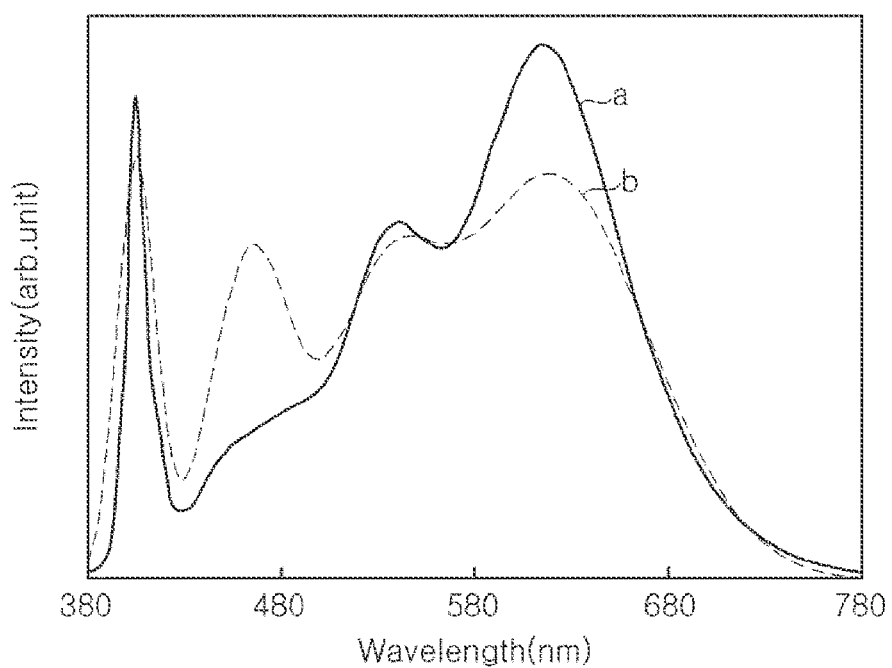
FIG. 2 is a graph illustrating spectra of white light emitted by the light emitting device according to the exemplary embodiment of the disclosed technology and white light emitted by a conventional light emitting device.

FIG. 2 is a graph illustrating spectra of white light emitted by the light emitting device according to an exemplary embodiment of the disclosed technology and white light emitted by a conventional light emitting device in the related art.

Referring to FIG. 2, line "b" is a graph illustrating a spectrum of white light emitted by the light emitting device according to the exemplary embodiment of the disclosed technology, and line "a" is a graph illustrating a spectrum of white light emitted by the conventional light emitting device in the related art.

When comparing lines "a" and "b" in a wavelength region of 460 to 480 nm, which corresponds to a blue light wavelength region, it may be appreciated that the light emitting device according to the exemplary embodiment of the disclosed technology emits white light including blue light having a relatively low intensity. It may be appreciated from the line "b" that a relative ratio of the intensity of the peak wavelength of the ultraviolet light, the intensity of the peak wavelength of the blue light, the intensity of the peak wavelength of the green light, and the intensity of the peak wavelength of the red light is approximately 4:1:2:3. In addition, it is measured that a color rendering index of white light emitted by the light emitting device according to the exemplary embodiment of the disclosed technology is 95.

The light emitting device and the lighting apparatus according to some implementations of the disclosed technology may emit white light including blue light having a low intensity and having a high color rendering index.

Figure 3:
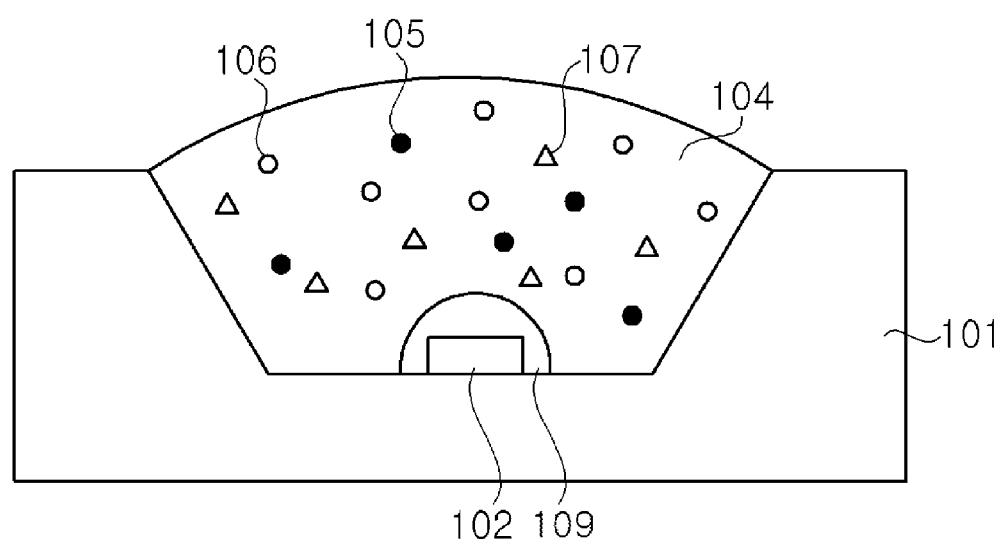
FIG. 3 is a cross-sectional view illustrating a light emitting device according to an exemplary embodiment of the disclosed technology.

FIG. 3 is a cross-sectional view illustrating a light emitting device according to another exemplary embodiment of the disclosed technology.

Referring to FIG. 3, the light emitting device is configured to include a housing 101, an ultraviolet light emitting diode 102, a molding part 104, red phosphors 106, green phosphors 105, blue phosphors 107, and a buffer part 109. The light emitting device according to the present exemplary embodiment differs from the above-described embodiment of the disclosed technology by including the buffer part 109.

The buffer part 109 may be disposed between the ultraviolet light emitting diode 102 and the molding part 104. The buffer part 109 may be made of or include a silicon resin or an epoxy resin. A hardness of the buffer part 109 may be smaller than that of the molding part 104. Thermal stress of the molding part 104 due to heat generated from the ultraviolet light emitting diode 102 may be prevented using the buffer part 109. Although the buffer part 109 has been described in this exemplary embodiment to have a convex semicircular shape in a region in the vicinity of the ultraviolet light emitting diode 102, other implementations are also possible regarding the shape of the buffer part 109.

Figure 4:
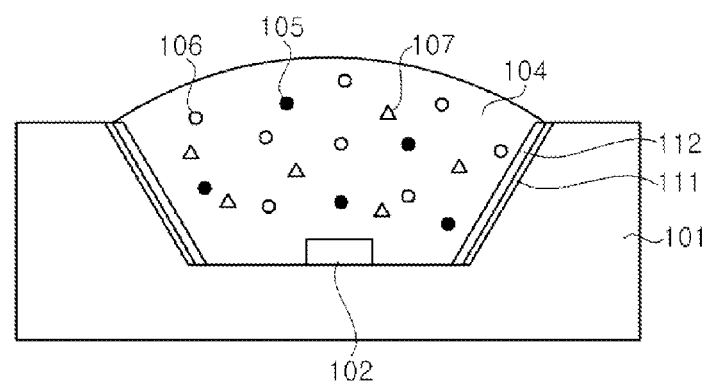
FIG. 4 is a cross-sectional view illustrating a light emitting device according to an exemplary embodiment of the disclosed technology.

FIG. 4 is a cross-sectional view illustrating a light emitting device according to another exemplary embodiment of the disclosed technology.

Referring to FIG. 4, the light emitting device is configured to include a housing 101, an ultraviolet light emitting diode 102, a molding part 104, red phosphors 106, green phosphors 105, blue phosphors 107, a reflector 111, and a barrier reflector 112. The light emitting device according to the present exemplary embodiment differs from the above-described the above-described embodiment of the disclosed technology by including the barrier reflector 112.

The reflector 111 may be disposed at a side surface of the molding part 104 so as to be spaced apart from the ultraviolet light emitting diode 102. The reflector 111 may maximize reflection of light emitted from the ultraviolet light emitting diode 102 and the phosphors 105, 106, and 107 to increase light emitting efficiency. The reflector 111 may be formed of or include any reflection coating film or a reflection coating material layer. The reflector 111 may be made of or include an inorganic material, an organic material, a metal material, or a metal oxide material, which has excellent heat resistance and light resistance. As an example, the reflector 111 may be configured to contain a metal or a metal oxide having high reflectivity, such as aluminum (Al), silver (Ag), gold (Au), titanium dioxide ($TiO_2$), or the like. The reflector 111 may be formed by depositing or coating the metal or the metal oxide on the housing 101 or be formed by printing metal ink. Alternatively, the reflector 111 may also be formed by attaching a reflection film or a reflection sheet onto the housing 101.

The barrier reflector 112 may cover the reflector 111. The barrier reflector 112 may prevent deterioration, or the like, of the reflector 111 due to heat emitted from the ultraviolet light emitting diode 102. The barrier reflector 112 may be made of or include an inorganic material or a metal material having high light resistance and reflectivity.

Figure 5:
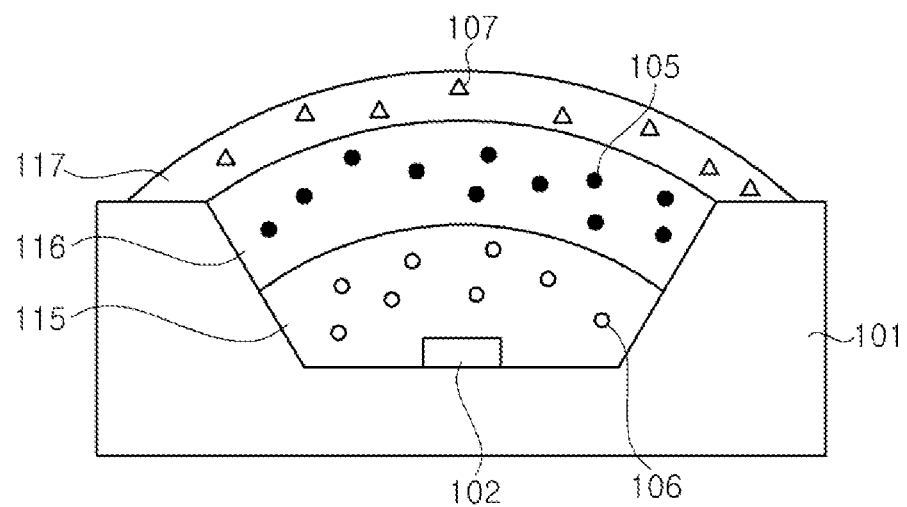
FIG. 5 is a cross-sectional view illustrating a light emitting device according to an exemplary embodiment of the disclosed technology.

FIG. 5 is a cross-sectional view illustrating a light emitting device according to another exemplary embodiment of the disclosed technology.

Referring to FIG. 5, the light emitting device is configured to include a housing 101, an ultraviolet light emitting diode 102, red phosphors 106, green phosphors 105, blue phosphors 107, a first molding part 115, a second molding part 116, and a third molding part 117. The light emitting device according to the present exemplary embodiment differs from the above-describe embodiment of the disclosed technology by including the first molding part 115, the second molding part 116, and the third molding part 117.

The first molding part 115 may cover the ultraviolet light emitting diode 102. The second molding part 116 may cover the first molding part 115. The third molding part 117 may cover the second molding part 116. The first molding part 115, the second molding part 116, and the third molding part 117 may be made of or include materials having the same hardness or different hardness. When the first to third molding parts 115 to 117 include materials having different hardness, the hardness of the first molding part 115 may be lower than that of the second molding part 116, and the hardness of the second molding part 116 may be lower than that of the third molding part 117. In this case, thermal stress due to the ultraviolet light emitting diode 102 may be alleviated as already explained for the buffer part 109 in the above-mentioned exemplary embodiment.

The first molding part 115 may contain the red phosphors 106. The second molding part 116 may contain the green phosphors 105. The third molding part 117 may contain the blue phosphors 107. Phosphors emitting a long wavelength are disposed at a lower portion and phosphors emitting a short wavelength are disposed at an upper portion, thereby making it possible to prevent blue light emitted from the blue phosphors 107 from being again absorbed and lost in the green and red phosphors 105 and 106.

Figure 6:
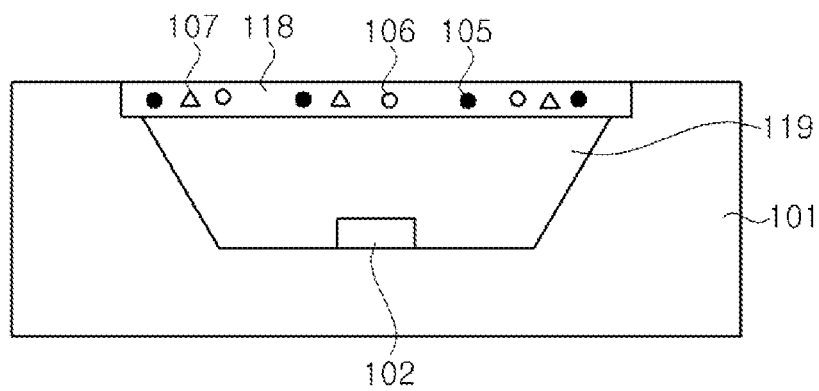
FIG. 6 is a cross-sectional view illustrating a light emitting device according to an exemplary embodiment of the disclosed technology.

FIG. 6 is a cross-sectional view illustrating a light emitting device according to another exemplary embodiment of the disclosed technology.

Referring to FIG. 6, the light emitting device is configured to include a housing 101, an ultraviolet light emitting diode 102, red phosphors 106, green phosphors 105, blue phosphors 107, a phosphor plate 118, and a space 119. The light emitting device according to the present exemplary embodiment differs from the above-described embodiment of the disclosed technology by including the phosphor plate 118 instead of the molding part 104.

The phosphor plate 118 may be disposed above the ultraviolet light emitting diode 102 so as to be spaced apart from the ultraviolet light emitting diode 102, and may include the phosphors 105, 106, and 107. The phosphor plate 118 may be made of or include an epoxy resin or a silicon resin.

Since the phosphors 105, 106, and 107 are disposed so as to be spaced apart from the ultraviolet light emitting diode 102, damage to the phosphors 105, 106, and 107 and the phosphor plate 118 due to heat or light may be decreased. Therefore, reliability of the phosphors 105, 106, and 107 may be secured or improved.

The space 119 may be formed between the phosphor plate 118 and the ultraviolet light emitting diode 120, and may be an empty space or be filled with a silicon or acryl resin.

Hereinabove, the light emitting devices according to various exemplary embodiments of the disclosed technology have been described. The light emitting devices according to the above-mentioned exemplary embodiments may be applied to various fields. For example, since the light emitting devices according to the exemplary embodiments of the disclosed technology have a high color rendering index and have a decreased intensity of the blue light, which is bad light to human, they may be applied to a lighting apparatus.

The white light emitted by the light emitting diode according to the exemplary embodiment of the disclosed technology includes the blue light having a low intensity. Therefore, the lighting apparatus including the light emitting diode according to the exemplary embodiment of the disclosed technology does not hinder generation of Melatonin in a human body. Therefore, disturbance of lifespan cycles of people may be prevented, and diseases caused by blue light having a high intensity may be prevented.

In addition, the light emitting diode according to the exemplary embodiment of the disclosed technology may emit the white light having an improved color rendering index.

Only a few implementations and examples are described. Other implementations, enhancements and variations can be made based on what is described and illustrated in this patent document.

What is claimed is:

1. A light emitting device comprising:
    an ultraviolet light emitting diode to emit light in an ultraviolet wavelength region;
    blue phosphors, green phosphors, and red phosphors excitable by the ultraviolet light emitted by the ultraviolet light emitting diode to emit corresponding light that is combined with the ultraviolet light to form white light; and
    a converting part covering the ultraviolet light emitting diode comprising:
    a first molding part comprising the red phosphors covering the ultraviolet light emitting diode;
    a second molding part comprising the green phosphors covering the first molding part; and
    a third molding part comprising the blue phosphors covering the second molding part,
    wherein the white light includes ultraviolet light, green light, blue light, and red light,
    an intensity of a peak wavelength of the green light is in a range of 1.8 to 2.1 times the intensity of a peak wavelength of the blue light,
    an intensity of a peak wavelength of the red light is in a range of 2.8 to 3.1 times the intensity of the peak wavelength of the blue light, and
    the converting part has a hardness increasing from the first molding part to the third molding part.

2. The light emitting device of claim 1, wherein an intensity of a peak wavelength of the ultraviolet light is in a range of 3.8 to 4.1 times the intensity of the peak wavelength of the blue light.

3. The light emitting device of claim 1, wherein the white light has a color rendering index (CRI) of 95 or more.

4. The light emitting device of claim 1, wherein the white light has a special color rendering index (R9) of 90 or more.

5. The light emitting device of claim 1, wherein a peak wavelength of the ultraviolet light emitting diode is in a range of 380 to 420 nm.

6. The light emitting device of claim 1, wherein a half-width of a peak wavelength of the blue phosphor is in a range of 80 to 85 nm, a half-width of a peak wavelength of the green phosphor is in a range of 49 to 82nm, and a half-width of a peak wavelength of the red phosphor is in a range of 66 to 93 nm.

7. The light emitting device of claim 1, wherein a peak wavelength of the blue phosphor is in a range of 460 to 482 nm, a peak wavelength of the green phosphor is in a range of 520 to 545 nm, and a peak wavelength of the red phosphor is in a range of 610 to 650nm.

8. A lighting apparatus comprising:
    a light emitting device including:
    an ultraviolet light emitting diode to emit light in an ultraviolet wavelength region; and
    blue phosphors, green phosphors, and red phosphors excitable responsive to the light emitted by the ultraviolet light emitting diode to emit respective lights of different wavelengths including blue light, green light, and red light that in combination with the ultraviolet light form white light,
    a converting part covering the ultraviolet light emitting diode comprising:
    a first molding part comprising the red phosphors covering the ultraviolet light emitting diode;
    a second molding part comprising the green phosphors covering and contacting the first molding part; and
    a third molding part comprising the blue phosphors covering and contacting the second molding part,
    wherein an intensity of a peak wavelength of the green light is in a range of 1.8 to 2.1 times the intensity of a peak wavelength of the blue light,
    wherein an intensity of a peak wavelength of the red light is in a range of 2.8 to 3.1 times the intensity of the peak wavelength of the blue light, and
    the converting part has a hardness increasing from the first molding part to the third molding part.

9. The lighting apparatus of claim 8, wherein an intensity of a peak wavelength of the ultraviolet light is in a range of 3.8 to 4.1 times the intensity of the peak wavelength of the blue light.

10. The lighting apparatus of claim 8, wherein the white light has a color rendering index (CRI) of 95 or more.

11. The lighting apparatus of claim 8, wherein the white light has a special color rendering index (R9) of 90 or more.

12. The lighting apparatus of claim 8, wherein a peak wavelength of the ultraviolet light emitting diode is in a range of 380 to 420 nm.

13. The lighting apparatus of claim 8, wherein a peak wavelength of the blue phosphor is in a range of 460 to 482 nm, a peak wavelength of the green phosphor is in a range of 520 to 545 nm, and a peak wavelength of the red phosphor is in a range of 610 to 650 nm.

* * * * *